United States Patent [19]

Guillaumin

[11] Patent Number: 4,704,578

[45] Date of Patent: Nov. 3, 1987

[54] THERMAL COMPENSATION METHOD FOR A MAGNETIC CIRCUIT HAVING AN OSCILLATING CIRCUIT WITH AN INDUCTANCE COIL

[75] Inventor: Jacques Guillaumin, Les Lilas, France

[73] Assignee: Jeumont-Schneider Corporation, France

[21] Appl. No.: 722,334

[22] Filed: Apr. 12, 1985

[30] Foreign Application Priority Data

Apr. 20, 1984 [FR] France ................................ 84 06284

[51] Int. Cl.⁴ ......................... H01F 15/16; B61L 3/12; H03L 1/00; G01R 33/00

[52] U.S. Cl. .................................... 324/225; 246/249; 324/207; 324/236; 331/176; 336/179

[58] Field of Search ................................ 324/224-226, 324/234, 236, 237, 207, 208; 336/179; 340/551, 941; 331/65, 66, 176, 181-183; 361/180; 246/122 R, 247, 249; 335/217

[56] References Cited

U.S. PATENT DOCUMENTS

| | | | |
|---|---|---|---|
| 3,194,998 | 7/1965 | Marfut | 336/179 X |
| 3,440,718 | 4/1969 | Pitt et al. | 336/179 X |
| 3,662,307 | 5/1972 | Tsukuda et al. | 336/179 X |
| 3,663,913 | 5/1972 | Kato et al. | 336/179 |
| 3,688,187 | 8/1972 | Loos | 324/234 X |
| 3,848,466 | 11/1974 | Dial et al. | 324/233 X |
| 3,891,918 | 6/1975 | Ellis | 324/208 |
| 4,267,508 | 5/1981 | Ando | 324/225 |
| 4,270,487 | 6/1981 | Terashima et al. | 324/236 X |
| 4,449,094 | 5/1984 | MacFadden et al. | 335/217 X |

FOREIGN PATENT DOCUMENTS

| | | | |
|---|---|---|---|
| 2643413 | 3/1978 | Fed. Rep. of Germany | 324/236 |
| 2025984 | 12/1969 | France . | |
| 2422930 | 4/1979 | France . | |
| 2469722 | 11/1979 | France . | |
| 0681365 | 8/1979 | U.S.S.R. | 324/225 |

OTHER PUBLICATIONS

French Search Report, Feb. 8, 1985.

*Primary Examiner*—Gerard R. Strecker

*Attorney, Agent, or Firm*—Rines and Rines, Shapiro and Shapiro

[57] ABSTRACT

The present invention involves a thermal compensation procedure for magnetic circuits, such as those used in security devices detecting metallic masses, whose losses increase as a function of ambient temperature. According to the invention a body is placed in the immediate proximity of the magnetic circuit, the body being made of a material whose magnetic permeability is a decreasing function of temperature and whose Curie point equals the maximum possible ambient temperature.

10 Claims, 1 Drawing Figure

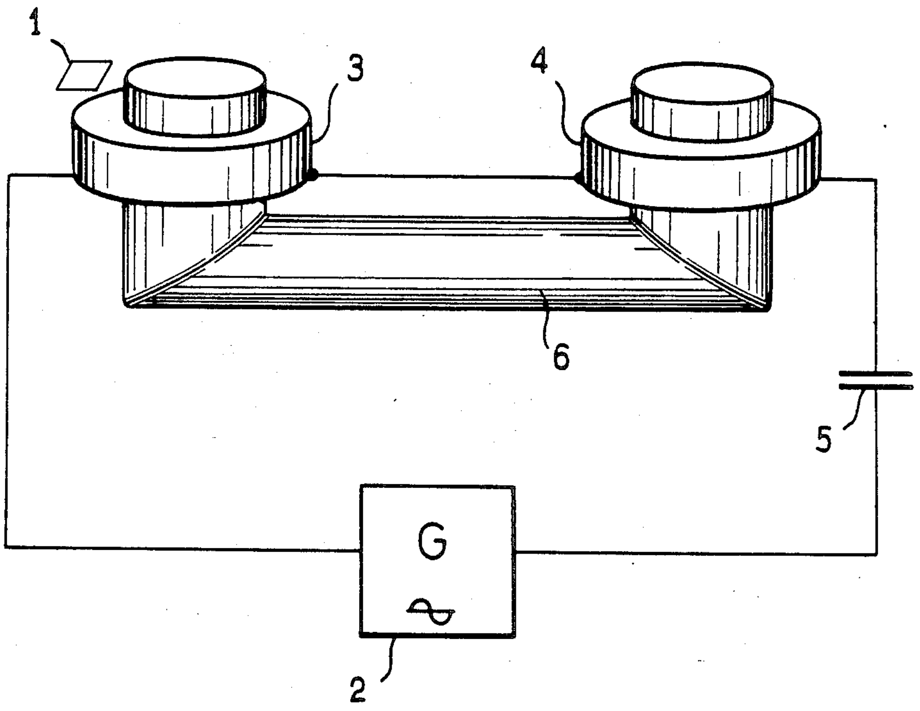
1
3
4
6
5
G
2

THERMAL COMPENSATION METHOD FOR A MAGNETIC CIRCUIT HAVING AN OSCILLATING CIRCUIT WITH AN INDUCTANCE COIL

The present invention involves a thermal compensation method for a magnetic circuit whose losses increase as a function of ambient temperature.

Such a method can be used advantageously in the metallic mass detector used for security purposes described in French Pat. No. 2 469,722. This device, notably used to detect the passage of carriage wheels, is composed of an oscillating series circuit with a gap open toward the detection zone containing a pick-up, an oscillator connected to the oscillating circuit, and a circuit exploiting the overvoltage coefficient (also commonly referred to as the "Q") of the oscillating circuit. This oscillating circuit is composed of coils of copper wire. The operation of such a device is based on the fact that when a metallic mass is near the gap, the overvoltage coefficient of the oscillating circuit decreases. This decrease indicates the presence of the metallic mass. To increase the detector's sensitivity, it is preferable that when no metallic mass is near the circuit, the losses due to eddy currents be very low, and thus that the overvoltage coefficient of the circuit be high. However, it is observed that when the ambient temperature increases, the losses, due notably to the increased resistance in the copper in the coils, increase also; this leads to a decrease of the overvoltage coefficient, which impairs the sensitivity of the detector.

An object of the present invention is to eliminate these inconveniences, and to do so, the invention offers a novel thermal compensation method for a magnetic circuit.

In summary, according to the present invention, the thermal compensation procedure for a magnetic circuit whose losses increase as a function of ambient temperature involves placing in the immediate proximity of the magnetic circuit a body made of a material whose magnetic permeability is a decreasing function of temperature and whose Curie point is equal to the maximum possible ambient temperature.

This compensation procedure can be favorably applied to an oscillating circuit including an inductance coil.

When this technique is applied for the thermal compensation of a metallic mass detector composed of an oscillating series circuit with gap, it involves placing in the immediate vicinity of one of the extremities of the magnetic core a body made of a material whose magnetic permeability is a decreasing function of temperature and whose Curie point equals the maximum possible ambient temperature. Ideally, the material for the body should be chosen from the group including soft iron and ferronickel and should have a Curie point between 40° C. and 50° C.

The following description of an application of the present invention (in connection with the appended drawing) will provide a better understanding of the invention and a clearer perception of its other uses, advantages, and characteristics.

The single FIGURE of the drawing herein schematically represents a detector composed of an oscillating circuit with gap, to which the thermal compensation method of the invention is applied.

According to this FIGURE, the oscillating circuit contains a condenser (5) with low losses and an inductance coil (3,4) connected in series with the condenser (5). The inductance coil is composed of two identical coils connected in series and each wound around one of the two arms of a U-shaped magnetic core (6) which defines an open gap. The oscillating circuit is completed by an alternating current generator (2) which supplies the current.

A body (1) made of a material whose magnetic permeability decreases as a function of temperature and whose Curie point equals the maximum possible ambient temperature is placed in the immediate proximity of the inductance coil. It can be attached by glue or by molding with impregnated resin around one of the coils of the inductance coil, for example coil 3. This body is placed in the magnetic field of the detector and, being of conductive material, it is thus the site of eddy currents. When the temperature increases, it approaches the Curie point of the material in the body, and the body's permeability decreases. This leads to a decrease in the eddy currents and thus a decrease in the losses in the body. This compensates the increase in losses due notably to the increase in resistance of the copper in the coils. The result is that when the ambient temperature increases, the overvoltge coefficient of the oscillating circuit does not vary, because a decrease due to the increased resistance of the copper in the coils is compensated by an increase due to the decrease of the permeability of the material making up the body (1).

Therefore, this thermal compensation method maintains the overvoltage coefficient of the oscillating circuit constant as the temperature increases, and consequently, the detector can permanently offer great stability and sensitivity.

Furthermore, this thermal compensation procedure is especially useful in security devices because the body may be attached to the detector, such that an accidental increase in the overvoltage coefficient due to the disappearance of the body cannot occur. Although only one application of the invention has been described, it is clear that various modifications are possible which would not be outside the scope of the present invention.

I claim:

1. A method of thermally compensating an oscillating circuit having an inductance coil, comprising securing a conductive material proximate said inductance coil so that said material is magnetically coupled to said inductance coil, whereby eddy currents will be induced in said material by a magnetic field of said inductance coil, said material having a magnetic permeability which is a decreasing function of temperature and a Curie point equal to a maximum expected ambient temperature and, when subjected to said magnetic field, exhibiting changes in losses due to said eddy currents which compensate changes in losses due to varying resistance in said circuit with changing ambient temperature such that the overvoltage coefficient of said circuit remains substantially constant as the ambient temperature varies.

2. A method in accordance with claim 1, wherein said material has a Curie point between 40° C. and 50° C.

3. A method in accordance with claim 1, wherein said material is selected from the group consisting of soft iron and ferronickel.

4. A method in accordance with claim 1, wherein said placing includes securing said material to said inductance coil.

5. A method of thermally compensating a metallic mass detector having a magnetic core with two extremities defining a gap and an oscillating series circuit with inductance coil means surrounding portions of said core, said method comprising securing a conductive material proximate said inductance coil means so that said material is magnetically coupled to said inductance coil means, whereby eddy currents will be induced in said material by a magnetic field of said inductance coil means, said material having a magnetic permeability which is a decreasing function of temperature and a Curie point equal to a maximum expected ambient temperature and, when subjected to said magnetic field, exhibiting changes in losses due to said eddy currents which compensate changes in losses due to varying resistance in said circuit with changing ambient temperature such that the overvoltage coefficient of said circuit remains substantially constant as the ambient temperature varies.

6. A method in accordance with claim 5, wherein said placing includes locating said material adjacent one of said two extremities of said core.

7. A method in accordance with claim 5, wherein said locating includes securing said material to said detector.

8. A method in accordance with claim 7, wherein said securing includes attaching said material to said inductance coil means.

9. A method in accordance with claim 5, wherein said material has a Curie point between 40° C. and 50° C.

10. A method in accordance with claim 5, wherein said material is selected from the group consisting of soft iron and ferronickel.

* * * * *